United States Patent
Rius Vazquez et al.

(10) Patent No.: US 7,336,088 B2
(45) Date of Patent: Feb. 26, 2008

(54) METHOD AND APPARATUS FOR DETERMINING IDDQ

(76) Inventors: Josep Rius Vazquez, Miracle, 17, 08028 Barcelona (ES); Jose De Jesus Pineda De Gyvez, Prof. Holstlaan 6, 5656 AA Eindhoven (NL)

( * ) Notice: Subject to any disclaimer, the term of this patent is extended or adjusted under 35 U.S.C. 154(b) by 81 days.

(21) Appl. No.: 10/528,253

(22) PCT Filed: Aug. 8, 2003

(86) PCT No.: PCT/IB03/03553

§ 371 (c)(1),
(2), (4) Date: Mar. 17, 2005

(87) PCT Pub. No.: WO2004/027438

PCT Pub. Date: Apr. 1, 2004

(65) Prior Publication Data

US 2006/0250152 A1    Nov. 9, 2006

(30) Foreign Application Priority Data

Sep. 20, 2002 (EP) .................................. 02078906

(51) Int. Cl.
*G01R 31/02* (2006.01)
(52) U.S. Cl. .................................................. 324/763
(58) Field of Classification Search .............. None
See application file for complete search history.

(56) References Cited

U.S. PATENT DOCUMENTS

| | | | | |
|---|---|---|---|---|
| 5,731,700 A * | 3/1998 | McDonald | ............... | 324/158.1 |
| 5,917,331 A * | 6/1999 | Persons | ....................... | 324/765 |
| 6,037,796 A * | 3/2000 | Graef et al. | ................. | 324/765 |
| 6,118,293 A * | 9/2000 | Manhaeve et al. | .......... | 324/765 |
| 6,348,806 B1 * | 2/2002 | Okandan et al. | ............. | 324/763 |
| 6,535,015 B1 * | 3/2003 | Krishnan et al. | ........... | 324/769 |
| 6,845,480 B2 * | 1/2005 | Wang | ........................ | 714/741 |
| 2005/0270054 A1 * | 12/2005 | Van Hees | .................... | 324/765 |

* cited by examiner

*Primary Examiner*—Ha Tran Nguyen
*Assistant Examiner*—Richard Isla-Rodas
(74) *Attorney, Agent, or Firm*—Peter Zawilski

(57) ABSTRACT

A test apparatus for testing a device under test (DUT) to detect a defect comprises a measurement circuit (ME), a threshold circuit (TH), and a control circuit (CG). The measurement circuit (ME) comprises a counter (C1) which counts clock pulses (OLK) during a count period (TC) to obtain a counted number (N) of clock pulses (CLK). The count period (TC) has a start determined by the start (tl) of a testing cycle which occurs at the instant a switch (S) which is coupled to an terminal (IN) of the device under test (DUT) removes a power supply voltage (VDD) from the terminal (IN) and the voltage (VDD') at the terminal (IN) starts decaying. An end of the count period (TC) is determined by an instant (t2) a comparator (COM1) detects that the voltage (VDD') at the terminal (IN) crosses a reference value (VREF). The control circuit (CG) generates the clock signal (CLK) and/or a reference number (NTH) taking into account the variability of the manufacturing process of the circuit under test (CUT). The threshold circuit (TH) generates a pass/fail signal (PF) by comparing the counted number (N) and the reference number (NTH).

14 Claims, 3 Drawing Sheets

Figure 1:
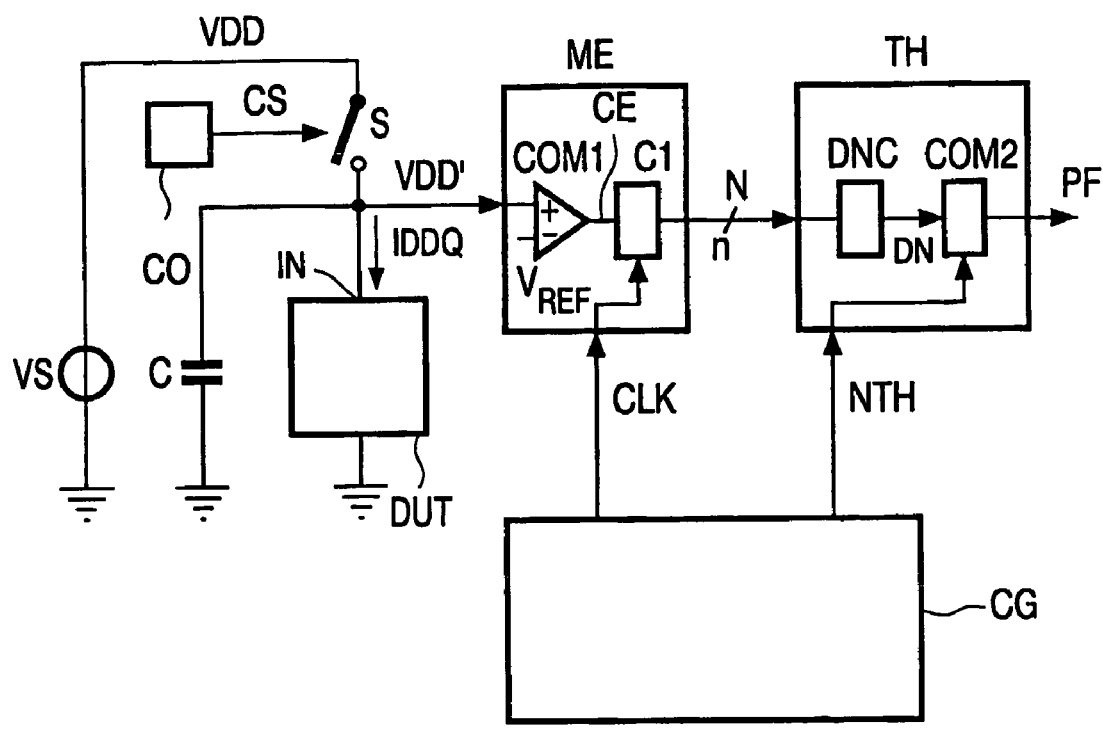

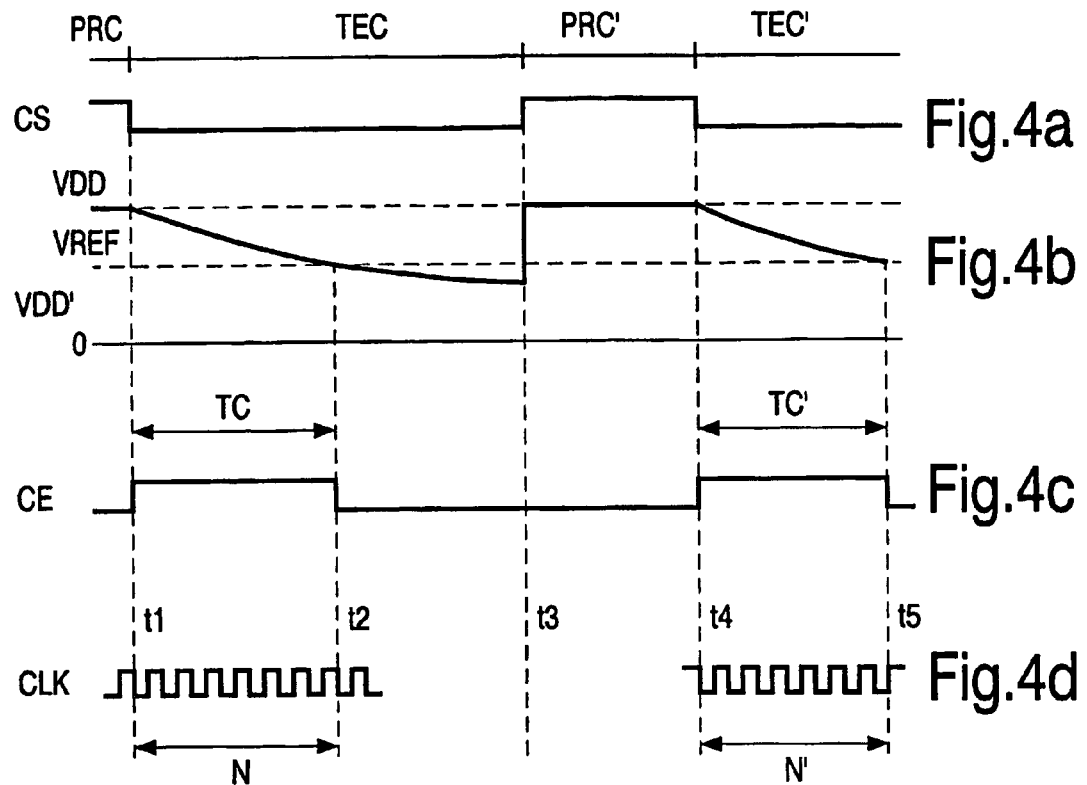
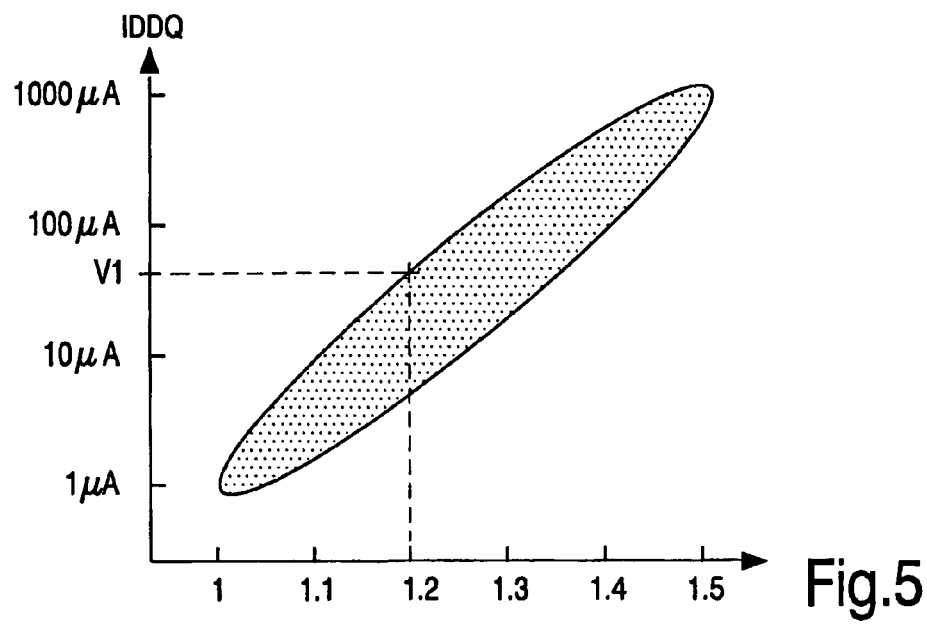

METHOD AND APPARATUS FOR DETERMINING IDDQ

The invention relates to a test apparatus for testing a device under test to detect a defect, a method of testing, and an integrated circuit comprising a test circuit.

The publication "A built-in quiescent current monitor for CMOS VLSI circuits", of A. Rubio et al, Proceedings of EDTC, IEEE, 1995, pages 581-585 discloses an on-chip IDDQ monitor for CMOS digital circuits. This IDDQ monitor measures the drain to drain quiescent current (the IDDQ) to provide a pass or fail for the circuit under test (further referred to as CUT). A built-in controlled switch actuates on the VDD power supply line of the CUT. At the start of the IDDQ measurement, the switch disconnects the power supply voltage from the power supply line. The measurement of the defective current IDDQ of the CUT is obtained through observation of the decaying speed of the voltage in the parasitic capacitance of the power supply line of the CUT. For small changes, this voltage decreases linearly with time. The decaying time which is representative for the IDDQ of the CUT, is measured as the time between the instant the switch disconnects the power supply voltage from the power supply line and the instant the decreasing voltage at the power supply line drops below a reference value.

It is an object of the invention to provide a testing of a circuit under test, which measures the IDDQ more accurately.

A first aspect of the invention provides a testing apparatus for testing a device under test to detect a defect as claimed in claim 1. A second aspect of the invention provides a method of testing as claimed in claim 13. A third aspect of the invention provides an integrated circuit comprising a test circuit as claimed in claim 14. Advantageous embodiments are defined in the dependent claims.

The test apparatus for testing the circuit under test (CUT) to detect a defect comprises a counter which counts clock pulses during a count period to obtain a counted number of clock pulses. The count period has a start determined by the start of the testing cycle which occurs at the instant the switch which is coupled to a terminal of the CUT removes the power supply voltage from the terminal and the voltage at the terminal starts decaying due to the current IDDQ which discharges the DUT's capacitance which is intrinsically present at the terminal. The count period may start at the start of the testing cycle, or a predetermined delay time after the start of the testing cycle. An end of the count period is determined by an instant a comparator detects that the voltage at the input crosses the reference value. The end of the count period may be the instant the reference value is crossed or a known delay time after the reference value is crossed. Usually, the test apparatus tests the IDDQ of an integrated circuit. But, more generally, it is possible to determine a current drawn by a circuit under test from a pin being tested, after this pin has been disconnected from a power supply voltage, by counting the number of clock pulses which occur until the voltage at the pin tested drops below a reference voltage value. Usually, the pin to be tested is a power supply pin of the device under test.

At the end of the count period, the count value of the counter is inversely proportional to the CUT's IDDQ if the capacitance of the CUT and the IDDQ are assumed constant, which is an acceptable assumption in the range of supply voltages in which the test is performed.

The threshold circuit processes the counted number and the outcome is compared with a reference number to determine whether a defect exists in the device under test. To improve the accuracy of the determination of whether a defect exists, a control circuit controls the value of the reference number and or the frequency of the clock signal in dependence on the particular process parameters of the circuit under test.

The value of the IDDQ varies within a large range, for example from 1 micro to 1 milliampere depending on the process parameters of the CUT under test. The process parameters may change from one batch of wafers to the other, or even for CUT's at different positions at the same wafer. It was found that if the relevant process parameters are known, the IDDQ varies within a small range around a value within the large range. Thus, the accuracy of the detection whether the IDDQ has a value which indicates a defective CUT is improved when the reference number depends on the process parameters.

As the IDDQ may vary over a very large range, at a particular size of the counter, the accuracy of the measurement of the time indicating the value of the IDDQ will depend on the actual value of the IDDQ. At a high value of the IDDQ, the reference level is crossed within a short time and only a few clock pulses are counted. The resolution and thus the accuracy of the counter is low, and consequently the accuracy of the determination of the time is low. The accuracy of the time measurement is increased by increasing the clock frequency of the counter at high values of the IDDQ without the need of a large counter size. Thus, the accuracy of the determination of whether the IDDQ indicates a defect CUT by measuring the decay time by counting the clock pulses improves when the frequency of the clock pulses applied to the measurement counter depends on the process parameters of the CUT. If this speed is high, the frequency is selected to be relatively high to obtain sufficient resolution. If this speed is low, the frequency is selected to be relatively low to limit the size of the counter.

EP-A-0840227 discloses a test equipment which measures the drain to drain quiescent current (further referred to as IDDQ) to provide a pass or fail for the device under test (further referred to as DUT) which may be an integrated circuit. A first switch couples the power supply to the DUT and another switch returns a sense signal to the integrated circuit such that the power may be interrupted to measure the decay of the voltage across the integrated circuit. A monitor is coupled to the DUT to enable monitoring of the decay of the voltage. The monitor periodically samples the voltage, and each sampled voltage value is compared with a predetermined reference value. When is detected that the sampled value is lower than the reference value, the IDDQ is calculated based on the reference value and on the number of samples taken between the instant the first switch decoupled the power supply from the DUT until the sampled value is smaller than the reference value.

This prior art test system has to compare at each sample instant the sampled voltage value with a reference value, and has to calculate the IDDQ from the number of samples and the reference level. Consequently, a lot of operations have to be performed.

The invention provides a testing of a device under test, which measures the IDDQ using fewer operations.

In an embodiment as defined in claim 2, the control circuit has an input for receiving externally determined information on the correlation between the relative speed of the CUT and the range of the IDDQ.

As is elucidated with respect to FIG. 5, a strong correlation appeared to exist between the relative speed of the CUT as determined by the process parameters and the range of the IDDQ at a particular relative speed. The accuracy of the determination of whether a defect exists is improved by adapting the reference value as function of the relative speed to better fit the expected range of the IDDQ. Note that the outcome of the fabrication process is not identical for every integrated circuit in a wafer. This results in integrated circuits that have IDDQ and speed values that differ from each other. Therefore, the correlation function between both parameters may define an area of acceptable IDDQ values related to the relative CUT speed.

As the relative speed of the CUT depends on the process parameters with which the CUT is produced, the testing in accordance with an aspect of the invention takes the variability of the fabrication process into account.

The external information may be externally determined for one or more samples of the CUT of one and the same batch. The relevant information externally determined is supplied to the control circuit which sets the reference value and/or the clock frequency accordingly.

In an embodiment as defined in claim 3, the control circuit comprises an oscillator and a counter which counts the clock pulses generated by this oscillator during a predetermined period in time to determined the relative speed of the of the CUT. This is possible because the relative speed of the CUT determines the oscillator frequency of the oscillator. The control circuit has information about the correlation between the IDDQ and the relative speed, for example stored in a table. The controller determines the reference value depending on the relative speed measured. This enables to dynamically vary, for example for every device under test, the reference number based on the measured DUT's speed. This considerably improves the accuracy of the detection of faulty devices under test.

The controller may collect the information about the correlation itself as both the speed of the CUT and the value of the IDDQ is known.

In an embodiment as defined in claim 8, the threshold circuit comprises a difference circuit which determines a difference number which is the difference between a first counted number of clock pulses determined during a first count period and a second counted number of clock pulses determined during a second count period. A comparator compares the difference number with the reference number to determine whether a defect exists in the DUT. It is common practice to perform a multitude of test cycles on the same DUT to reliably detect a pass or fail. During each test cycle a count period will occur of which the duration depends on the IDDQ value occurring. Usually, before each test cycle, the integrated circuit is brought into one of a series of well defined states by presenting a test vector to it.

In this manner, only the difference of two count values is relevant for the outcome of the test. Now, it is not relevant at all that the count value is inversely proportional to the value of the IDDQ. As long as the difference is small enough, it is likely that no failure is present in the DUT. A differential test as such which is performed on the measured values of the IDDQ is known from U.S. Pat. No. B-6,239,606. The differential test enables to detect differences in the IDDQ which are much smaller than the background leakage current.

In an embodiment as defined in claim 9, the test apparatus performs a series of test cycles on the device under test. During each test cycle, a counted number is determined. Each counted number is compared with the currently stored minimum value of the counted numbers determined so far and the stored minimum value is replaced by the counted number if it is smaller. In the same manner a stored maximum value is replaced by the counted number if this is larger than the stored maximum value. After processing all the counted numbers the minimum and maximum values of the series of counted numbers is available. If the difference between these minimum and maximum values is lower than a reference number, the device under test passes the test.

In an embodiment as defined in claim 10, a presently counted number is compared with a previously stored counted number. The device under test passes the test if the difference is smaller than the reference number.

In embodiments as defined in claims 11 and 12, the clock generator comprises a temperature sensor which senses the temperature of the integrated circuit. The controller is adapted to control the reference number and/or the repetition frequency based on the sensed temperature also. This takes care of the temperature dependence of the IDDQ.

On the other hand, in an embodiment as defined in claims 5 and 6, as the output of the clock generator is related to the DUT's speed and the counted number obtained from the test apparatus is related to the IDDQ current, they can also be used to characterize the process corner where the integrated circuit has been manufactured.

These and other aspects of the invention are apparent from and will be elucidated with reference to the embodiments described hereinafter.

Figure 2:
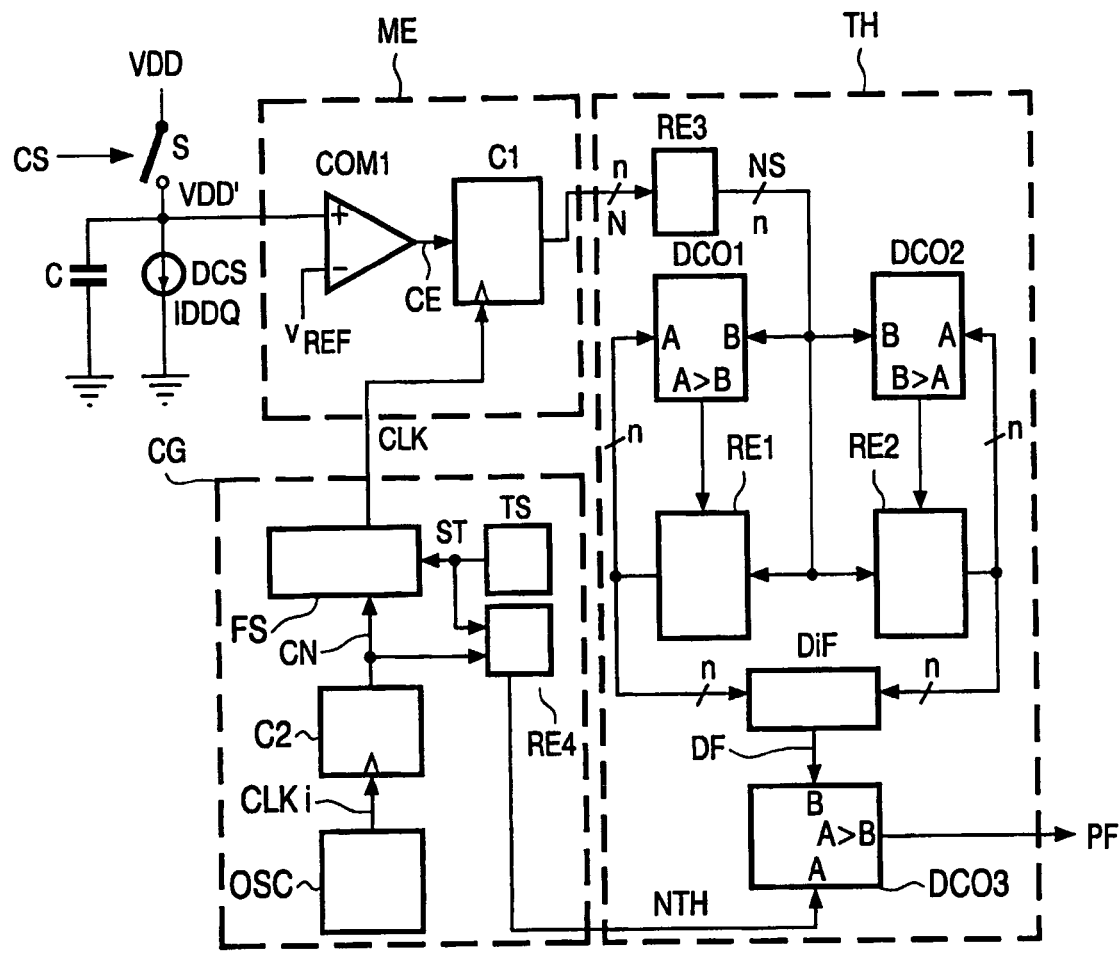
Figure 3:
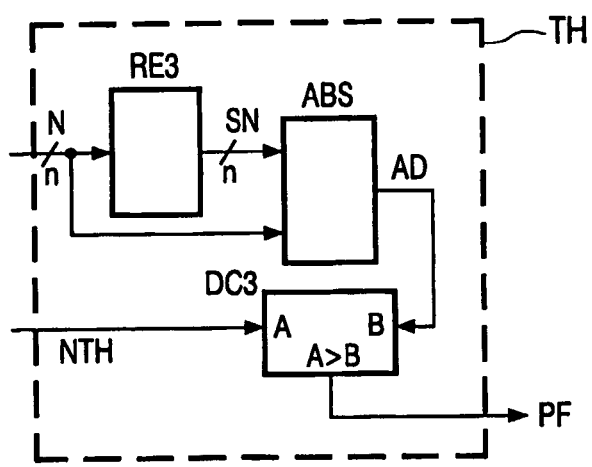

In the drawings:

FIG. 1 shows a basic block diagram of the test apparatus,

FIG. 2 shows a more detailed block diagram of an embodiment of the test apparatus in accordance with the invention, FIG. 3 shows a block diagram of an embodiment of the threshold circuit TH in accordance with the invention, FIG. 4 shows waveforms to elucidate the determination of the count value, and FIG. 5 shows a graph indicating an example of the correlation between the IDDQ and the relative speed.

The same references in different Figs. refer to the same signals or to the same elements performing the same function.

FIG. 1 shows a basic block diagram of the test apparatus.

The power supply source VS supplies a power supply voltage VDD via a switch S to an input IN of the device under test CUT. A control circuit CO supplies a control signal CS to the switch S. When the control signal CS controls the switch S to open, the quiescent current IDDQ drawn by the CUT out of the capacitor C connected to the input IN causes the voltage VDD' at the input IN to decrease. The capacitor C is an intrinsic capacitor formed by the circuit's intrinsic capacitance and any other intentionally added capacitance connected between VDD and ground.

A measurement circuit ME comprises a comparator COM1 which supplies an output signal CE which indicates when the voltage VDD' has a value larger than the reference voltage VREF. A counter C1 has a clock input to receive the clock signal CLK and an enable input to receive the output signal CE from the comparator COM1. The counter C1 counts the number of clock pulses N occurring during the time the output signal CE indicates that the voltage VDD' has a value larger than the reference voltage VREF. The counter C1 supplies the count number N as an n bit digital word.

The threshold circuit TH comprises a difference determining circuit DNC and a digital comparator COM2. The difference determining circuit DNC supplies a difference number DN which is the difference between two successive count numbers N, N', . . . or the difference between the maximum and minimum count numbers N's found during the application of different tests. The comparator COM2 compares the difference number DN with a reference number NTH to supply a signal PF which indicates whether the device under test DUT passes or fails the test. Usually, the device under test DUT fails the test if the difference number is larger than the reference number, because a large difference number indicates that at least two of the count numbers N, N', . . . and thus at least two of the values of the IDDQ differ considerably.

A clock generator circuit CG generates the clock signal CLK and the reference number NTH.

Thus, the measurement circuit ME converts a drop in the voltage VDD' from the power supply voltage VDD to the reference voltage VREF into a digital word (the counted value N) of n bits.

FIG. 2 shows a more detailed block diagram of an embodiment of the test apparatus in accordance with the invention.

Again, the test apparatus comprises the power supply source VS which supplies a power supply voltage VDD via a switch S to an input IN of the device under test DUT which now is modeled as a current source DCS. The control signal CS controls the switch S. When the control signal CS opens the switch S, the quiescent current IDDQ drawn by the DUT out of the capacitor C connected to the input IN causes the voltage VDD' at the input IN to decrease.

The measurement circuit ME shown in FIG. 2 is identical to the measurement circuit ME shown in FIG. 1, and supplies a n bit long counted number N for each test cycle TEC, TEC', . . . belonging to a test pattern. If $2^m$ test patterns are applied to the DUT, the test results (the counted values N, N', . . . ) may be stored in a memory before further processing by the threshold circuit TH. The threshold circuit TH may also process the test results directly as supplied by the measurement circuit ME.

The threshold circuit TH comprises registers RE1, RE2 and RE3, digital comparators DCO1, DCO2 and DCO3, and a subtractor DIF. The registers RE1, RE2 and RE3, the digital comparators DCO1 and DCO2, and a subtractor DIF are interconnected via a digital bus of n bits wide to exchange the required data. The data flow may be controlled by a microprocessor or a dedicated controller (not shown).

First, the registers RE1 and RE2 are initialized such that the register RE1 which has to store the lowest value of all the counted values N, N', . . . has a value as high as possible (111 . . . 111), and the register RE2 which has to store the highest value of all the count values N, N' . . . has a value as low as possible (000 . . . 000). Then, after each measurement of one of the counted numbers N, N', . . . , the counted number N of the counter C1 is stored in the register RE3. The content of the register RE3 is compared with the content of the register RE1 and with the content of the register RE2. If the content of the register RE3 is larger than the content of the register RE2, the content of the register RE3 is stored in the register RE2. If the content of the register RE3 is smaller than the content of the register RE1, the content of the register RE3 is stored in the register RE1.

After all measurements belonging to the $2^m$ test patterns have been performed, the subtractor DIF subtracts the content of the register RE1 from the register RE2 to obtain a difference number DF which is the maximum value of the counted numbers N, N', . . . minus the minimum value of the counted numbers N, N', . . . . The comparator DCO3 receives the difference number DF and the reference number NTH to supply the signal PF which indicates whether the device under test DUT passes or fails the test. If the difference number DF is larger than the reference number NTH, the signal PF indicates that the device under test DUT fails to pass the IDDQ test, otherwise, the signal PF indicates that the DUT passes the IDDQ test.

If all the measurements provide counted numbers N, N', . . . which are very near to each other, no failure which causes a higher IDDQ for one or more of the test patterns, occurred. A large offset current which is the same for all measurements will not influence the detection of differences in the IDDQ as long as the difference of two of the counted numbers N, N', . . . is determined.

Although the clock signal CLK may be selected to have a fixed value, to reach a desired accuracy, this value should be selected suitably high. Counter C1 counts a sufficient number of clock pulses of the clock signal CLK during a short count period TC when the DUT's IDDQ is large. For long count periods TC, a large amount of clock pulses has to be counted, and thus the number of bits of counter C1 should be large. Also the reference number NTH may be a fixed number selected to cover the spread of a batch of the same devices under test DUT.

However, as is elucidated with respect to FIG. 5, the IDDQ for devices under test DUT that should pass the test is strongly correlated to the relative DUT's speed. This dependence is illustrated with the gray area which indicates acceptable values of the IDDQ for different relative speeds. It is to be noted that a change of the relative speed with a factor 1.5 may be related to a change in the IDDQ of a factor 1000 or more, depending upon the technology. Consequently, if the relative speed is not known, the reference number NTH has to be selected higher than the highest value of the acceptable value of the IDDQ occurring at the highest relative speed of all the batches of devices under test DUT.

If the correlation between IDDQ and the relative speed is known, for example from separate measurements, it is possible for each particular device under test DUT to first measure the relative speed by counting (in counter C2) a number of clock pulses CLKi of an internal oscillator OSC, during a well defined period of time. Now, the counted number CN is representative for the relative speed of the particular device under test DUT. Also, it is possible to know the correlation between IDDQ and the relative speed of all the batches of manufactured devices under test by using the number N from the measurement circuit ME (as a measure of IDDQ), and the count number CN from the C2 counter in the clock generator CG (as a measure of the DUT speed).

Now, the clock generator CG comprises the oscillator OSC which generates a clock signal CLKi with a given frequency. The counter C2 counts the number CN of clock pulses CLKi occurring within a predetermined period of time. The number CN, which is a measure for the relative speed is supplied to the frequency scaler FS and the register RE4. The frequency scaler FS supplies the clock signal CLK to the counter C1. The actual frequency of the clock signal CLK depends on the number CN and thus on the relative speed measured for the particular device under test DUT. The register RE4 supplies the reference number NTH which also depends on the number CN and thus on the relative speed measured for the particular device under test DUT.

To summarize, if the relative speed of the particular device under test is known, the relation between the IDDQ and the relative speed (an example is shown in FIG. 5) allows to select an optimal reference number NTH. Also, if the expected range of the IDDQ is known, the clock frequency CLK can be set optimally such that the measurements during the test cycles are sufficiently precise, while the number of bits required for the counter C1 does not become excessively large.

Thus, the relative speed is measured first, before the IDDQ test cycles for a particular device under test start. The relative speed is used to optimally set the clock frequency of counter C1 from the number CN which indicates the relative speed. Further, the reference number is set from the number CN. For example, if in FIG. 5, the relative speed is measured to be 1.2, the reference number should be set to correspond to an IDDQ higher than the value V1 in FIG. 5.

An optional temperature sensor TS senses the temperature of the device under test and supplies the temperature signal ST to the frequency scaler FS and the register RE4 to compensate the clock signal CLK and the reference number NTH for temperature changes of the DUT.

As an example only, in a practical situation, the capacitor C has a value of 1 nanofarad, the ratio of the IDDQ and the relative speed for the devices under test DUT varies from 1 microampere at a relative speed 1.0 to 1 milliampere at a relative speed 1.5, and the difference between the power supply voltage VDD and the reference voltage VREF is 300 millivolts. The time required for the voltage VDD' to reach the reference voltage VREF after the switch S is opened is 300 nanoseconds if the IDDQ is 1 milliampere, or 300 microseconds if the IDDQ is 1 microampere. To obtain a minimum precision of 1% in the whole measurement range, the repetition frequency of the clock signal CLK should be 333 MHz and the counter C1 should be able to count 17 bit words.

If, again for example, the complete range of relative speeds is divided in three parts: part 1 from 1.0 to 1.16, part 2 from 1.16 to 1.33, and part 3 from 1.33 to 1.5, the range of expected IDDQ values is also divided in three parts respectively ranging from 1 to 10, 10 to 100, and 100 to 1000 microamperes. To obtain the same precision, the counter C1 has to be able to count only 10 bit words, because the repetition frequency of the clock signal CLK is respectively 3.3 MHz, 33 MHz, and 333 MHz. Off course it is possible to divide the range of relative speeds in more parts, or to continuously adapt the repetition frequency of the clock signal CLK as function of the relative speed measured.

FIG. 3 shows a block diagram of an embodiment of the threshold circuit TH in accordance with the invention. This threshold circuit TH determines the pass or fail signal PF from the difference of count numbers N, N', ... determined at different test vectors.

The n bit counted number N is supplied to the register RE3 and the circuit ABS via a n bit bus. The output of the register RE3 supplies the n bit stored number SN to the circuit ABS. The circuit ABS determines the absolute value of the difference AD of the counted number N and the stored number SN. The digital comparator DC3 compares the value of AD with the reference number NTH to supply the pass/fail signal PF.

To elucidate the operation of the threshold circuit TH, it is assumed that the register RE3 has stored the n bits counted number N (having the value Ni) occurring after the i-th test pattern was applied to the device under test DUT. The counted number N (having the value Ni+1) occurs after the (i+1)-th test pattern. The circuit ABS determines the absolute value of the difference AD between the counted number values Ni and Ni+1. The comparator compares this difference AD with the reference number NTH. If the value of AD is larger than the reference number NTH, the signal PF indicates a fail, otherwise, the signal PF indicates a pass.

FIG. 4 shows waveforms elucidating the determination of the counted value. FIG. 4A shows the control signal CS of the switch S, a high level indicates that the switch S is closed. FIG. 4B shows the voltage VDD' at the test pin IN of the device under test DUT. FIG. 4C shows the enable signal CE which enables the counter C1 to count the clock pulses CLK when its level is high. FIG. 4D shows the clock pulses CLK.

During the period PRC when the control signal CS has a high level and the switch S is closed, the power supply voltage VDD is present at the test pin IN. The device under test DUT is brought into a particular state by applying a test vector to it. At instant t1, the control signal CS changes towards the low level, the switch S is opened and the enable signal CE becomes high level. The voltage VDD' starts decreasing as the current IDDQ drawn at the test pin IN of the device under test DUT starts to discharge a capacitance C at the test pin IN. At instant t2, the voltage VDD' crosses the reference voltage VREF and the enable signal CE changes to the low level. The counter C1 counts the number N of clock pulses CLK occurring during the count period TC which lasts from instant t1 to instant t2 when the enable signal CE has the high level.

At instant t3, at the end of the test cycle TEC which started at instant t1, the control signal CS goes high again and a next period PRC' starts wherein the device under test DUT is powered and receives a next test vector. At instant t4, a next test cycle TEC' starts during which the counter C1 counts the number N' of clock pulses CLK occurring during the count period TC' which lasts from instant t4 to instant t5 when the enable signal CE has the high level.

FIG. 5 shows a graph indicating an example of the correlation between the IDDQ and the relative speed. The vertical axis shows the value of the IDDQ in microamperes, and the horizontal axis shows the relative speed.

The IDDQ for devices under test DUT that should pass the test is strongly correlated with the DUT's speed. This dependency is illustrated with the gray area which indicates acceptable values of the IDDQ for different relative speeds. It is to be noted that a change of the relative speed with a factor 1.5 is related to a change in the IDDQ of a factor 1000 or more, depending upon the technology.

It should be noted that the above-mentioned embodiments illustrate rather than limit the invention, and that those skilled in the art will be able to design many alternative embodiments without departing from the scope of the appended claims.

For example, the difference of counted numbers N, N', ... may be determined in another way as elucidated with respect to the embodiments in accordance with the invention shown in FIGS. 2 and 3.

In a dual implementation, the switch S arranged between the power supply VS and the input IN of the device under test DUT would be connected to ground instead of to the VDD pole of the power supply VS.

If this switch is integrated inside the device under test DUT, a faster sensor operation is possible because the capacitance C would become smaller.

If in order to provide leakage control, a technique called MTCMOS or any other leakage control technique, uses a switch S (a MOS transistor) to disconnect parts of the circuit in standby, this switch may be used as the switch S.

In the claims, any reference signs placed between parentheses shall not be construed as limiting the claim. The word "comprising" does not exclude the presence of elements or steps other than those listed in a claim. The invention can be implemented by means of hardware comprising several distinct elements, and by means of a suitable programmed computer. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A test apparatus for testing a quiescent current of a circuit under test, the test apparatus comprising a power supply voltage source for supplying a power supply voltage, a switch being coupled to a terminal of the circuit under test, a driver for controlling the switch to remove the power supply voltage from the terminal at a start of a testing cycle, a comparator for comparing a voltage at the terminal with a reference value, a clock generator for supplying clock pulses, a counter for counting the clock pulses during a count period to obtain a count number, wherein the count period has a start determined by the start of the testing cycle and an end determined by an instant the voltage at the terminal crosses the reference value, a threshold circuit for comparing the count number with a reference number to supply a pass/fail signal, and a control circuit for controlling the value of the reference number and/or a clock frequency of the clock pulses in dependence on process parameters of the circuit under test.

2. A test apparatus as claimed in claim 1, characterized in that the circuit under test is an integrated circuit and in that the control circuit comprises an input for receiving externally determined information on a correlation between on the one hand a speed of the circuit under test and on the other hand a range of the acceptable or unacceptable values of the quiescent current for determining the value of the reference number and/or the frequency of the clock pulses based on said correlation.

3. A test apparatus as claimed in claim 2, characterized in that the device under test is an integrated circuit and in that the control circuit comprises an oscillator for generating oscillator clock pulses having a frequency depending on the speed of the circuit under test, and a further counter for counting the oscillator clock pulses during a predetermined period in time to obtain a further counted number determining the speed of the of the circuit under test.

4. A test apparatus as claimed in claim 2, characterized in that the externally determined information indicates an acceptable range of values of the quiescent current as function of the speed, and in that the control circuit comprises a reference number calculator with an input for receiving the externally determined information on the correlation for determining the value of the reference number being larger than an upper value of the range of values of the quiescent current at the speed relevant for the circuit under test.

5. A test apparatus as claimed in claim 3, characterized in that the control circuit comprises a reference number calculator for determining the reference number based on the correlation between the speed obtained from the further counted number and the quiescent current obtained from the counted number.

6. A test apparatus as claimed in claim 2, characterized in that the clock generator comprises a clock control circuit with an input for receiving the externally determined information on the correlation for controlling the frequency of the clock pulses supplied by the clock generator to increase when the value of the quiescent current increases.

7. A test apparatus as claimed in claim 3, characterized in that the clock generator comprises a clock control circuit for controlling the frequency of the clock pulses supplied by the clock generator based on the correlation between the speed obtained from the further counted number and the quiescent current obtained from the counted number.

8. A test apparatus as claimed in claim 1, characterized in that the threshold circuit further comprises a difference circuit for determining a difference number being a difference between a first counted number of clock pulses during a first count period and a second counted number of clock pulses during a second count period, and a comparator for comparing the difference number with the reference number.

9. A test apparatus as claimed in claim 8, characterized in that the difference circuit comprises a memory for storing a minimum value and a maximum value of a series of counted numbers of clock pulses respectively, the minimum value representing the first counted number and the maximum value representing the second counted number.

10. A test apparatus as claimed in claim 8, characterized in that the difference circuit comprises a memory for storing the first counted number, the second counted number being determined during the second test cycle succeeding the first test cycle.

11. A test apparatus as claimed in claim 4, characterized in that the clock generator further comprises a temperature sensor for supplying a sensed temperature of the circuit under test, and in that the reference number calculator is adapted to control the reference number based on the sensed temperature also.

12. A test apparatus as claimed in claim 6, characterized in that the clock generator comprises a temperature sensor for supplying a sensed temperature of the circuit under test, and in that the clock control circuit is adapted to control the frequency of clock pulses based on the sensed temperature also.

13. A method of testing a circuit under test having a terminal, the method comprises supplying a power supply voltage via a switch being coupled to the terminal of the circuit under test, controlling the switch to remove the power supply voltage from the terminal at a start of a testing cycle, comparing a voltage at the terminal with a reference value, supplying clock pulses, counting the clock pulses during a count period to obtain a count number, wherein the count period has a start determined by the start of the testing cycle and an end determined by an instant the voltage at the terminal crosses the reference value, comparing the count number with a reference number to supply a pass/fail signal, and controlling the value of the reference number and/or a clock frequency of the clock pulses in dependence on process parameters of the circuit under test.

14. An integrated circuit comprising a test circuit for testing a drain to drain quiescent current drawn by at least part of the integrated circuit, the test circuit comprises a switch being coupled to a terminal of a circuit under test, a driver for controlling the switch to remove a power supply voltage from the terminal at a start of a testing cycle, a comparator for comparing a voltage at the terminal with a reference value, a clock generator for supplying clock pulses, a counter for counting the clock pulses during a count period to obtain a count number, wherein the count period has a start determined by the start of the testing cycle and an end determined by an instant the voltage at the terminal crosses the reference value, a threshold circuit for comparing the count number with a reference number to supply a pass/fail signal, and a control circuit for controlling the value of the reference number and/or a clock frequency of the clock pulses in dependence on process parameters of the circuit under test.

* * * * *